US010454017B2

(12) United States Patent
Sato

(10) Patent No.: US 10,454,017 B2
(45) Date of Patent: Oct. 22, 2019

(54) SEMICONDUCTOR PRESSURE SENSOR

(71) Applicant: Mitsubishi Electric Corporation, Tokyo (JP)

(72) Inventor: Kimitoshi Sato, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 16/135,017

(22) Filed: Sep. 19, 2018

(65) Prior Publication Data
US 2019/0273200 A1 Sep. 5, 2019

(30) Foreign Application Priority Data

Mar. 5, 2018 (JP) .................... 2018-038830

(51) Int. Cl.
| | | |
|---|---|---|
| H01L 41/113 | (2006.01) | |
| H01L 41/08 | (2006.01) | |
| H01L 41/053 | (2006.01) | |
| B81B 3/00 | (2006.01) | |

(52) U.S. Cl.
CPC ........ H01L 41/0825 (2013.01); B81B 3/0072 (2013.01); H01L 41/053 (2013.01); H01L 41/0533 (2013.01); H01L 41/081 (2013.01); H01L 41/1132 (2013.01); H01L 41/1138 (2013.01)

(58) Field of Classification Search
CPC . H01L 41/053; H01L 41/0533; H01L 41/081; H01L 41/0825; H01L 41/1132; H01L 41/1138; H01L 41/311; H01L 41/332; G01L 9/0042; G01L 9/0045; G01L 9/0047; G01L 9/0048; B81B 3/0072
See application file for complete search history.

(56) References Cited

U.S. PATENT DOCUMENTS

| | | | | |
|---|---|---|---|---|
| 5,894,452 | A * | 4/1999 | Ladabaum ............ | B06B 1/0292 367/163 |
| 6,373,115 | B1 * | 4/2002 | Kolb .................. | B81C 1/00182 257/414 |
| 7,382,599 | B2 * | 6/2008 | Kikuiri ................. | G01L 9/0073 361/280 |
| 2001/0024711 | A1 * | 9/2001 | Werner ............... | B81C 1/00158 428/138 |
| 2007/0190680 | A1 * | 8/2007 | Fukuda ................. | B81C 1/0023 438/50 |
| 2008/0184549 | A1 * | 8/2008 | Nguyen-Dinh ....... | B06B 1/0292 29/594 |

(Continued)

FOREIGN PATENT DOCUMENTS

| | | |
|---|---|---|
| JP | 2011-237364 A | 11/2011 |
| JP | 2012-026956 A | 2/2012 |

Primary Examiner — Stephen W Smoot
(74) Attorney, Agent, or Firm — Studebaker & Brackett PC

(57) ABSTRACT

A semiconductor pressure sensor includes: a first semiconductor substrate having a surface; an oxide film provided on the surface of the first semiconductor substrate and having a cavity; a second semiconductor substrate bonded to the first semiconductor substrate via the oxide film and having a diaphragm above the cavity; and a piezoelectric device provided on the diaphragm, wherein no recess is provided in the surface of the first semiconductor substrate within a region of the diaphragm, and a stress mitigating groove is provided in the oxide film outside and around the diaphragm.

3 Claims, 9 Drawing Sheets

(56) References Cited

U.S. PATENT DOCUMENTS

2011/0278685 A1    11/2011  Yoshikawa et al.
2014/0352445 A1*   12/2014  Kuisma ................ G01L 9/0072
                                                            73/717

* cited by examiner

SEMICONDUCTOR PRESSURE SENSOR

BACKGROUND OF THE INVENTION

Field

The present invention relates to a semiconductor pressure sensor with a diaphragm for measuring atmospheric pressure and the like.

Background

Conventionally, a recess is formed in the surface of a substrate within a diaphragm region to provide a cavity (see, for example, Japanese Patent Application Laid-open No. 2011-237364).

SUMMARY

Forming a recess in the surface of the substrate results in an increased height of the cavity below the diaphragm. This could increase the amount of deflection of the diaphragm, and the diaphragm could be subject to a stress of more than its fracture strength. Thin diaphragms were prone to break, because of which the handling was difficult.

The present invention was made to solve the problem described above and it is an object of the invention to obtain a semiconductor pressure sensor that has a thin but hardly breakable diaphragm and is easy to handle.

A semiconductor pressure sensor according to the present invention includes: a first semiconductor substrate having a surface; an oxide film provided on the surface of the first semiconductor substrate and having a cavity; a second semiconductor substrate bonded to the first semiconductor substrate via the oxide film and having a diaphragm above the cavity; and a piezoelectric device provided on the diaphragm, wherein no recess is provided in the surface of the first semiconductor substrate within a region of the diaphragm, and a stress mitigating groove is provided in the oxide film outside and around the diaphragm.

In the present invention, since no recess is formed in the surface of the first semiconductor substrate which functions as a stopper for the diaphragm, the height of the cavity is determined by the film thickness of the oxide film. By controlling the film thickness of the silicon oxide film, the height of the cavity can be easily set such that the diaphragm will not be subjected to a stress of its fracture strength or more. The stress mitigating groove provided in the oxide film around the diaphragm can reduce the warping. Thus a semiconductor pressure sensor having a hardly breakable diaphragm and easy to handle can be obtained.

Other and further objects, features and advantages of the invention will appear more fully, from the following description.

DESCRIPTION OF EMBODIMENTS

A semiconductor pressure sensor according to the embodiments of the present invention will be described with reference to the drawings. The same components will be denoted by the same symbols, and the repeated description thereof may be omitted.

Embodiment 1

Figure 1:
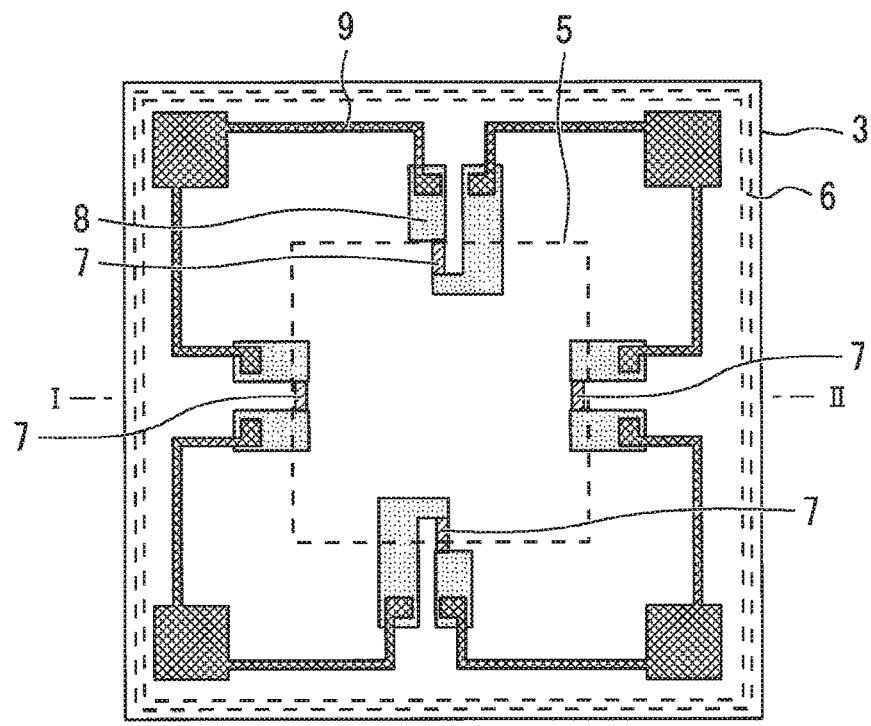
FIG. 1 is a plan view illustrating a semiconductor pressure sensor according to Embodiment 1.
Figure 2:
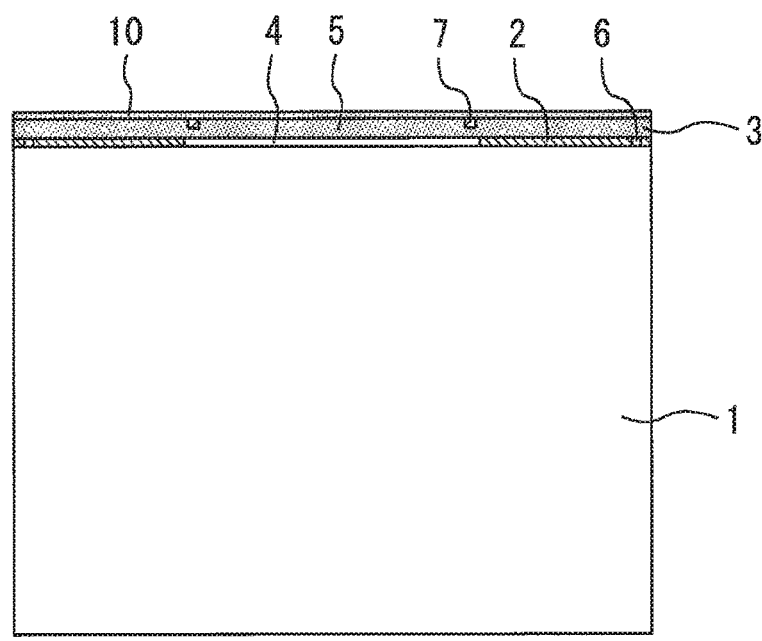
FIG. 2 is a cross-sectional view along I-II of FIG. 1.

FIG. 1 is a plan view illustrating a semiconductor pressure sensor according to Embodiment 1. FIG. 2 is a cross-sectional view along I-II of FIG. 1, A silicon oxide film 2 is formed on the surface of a silicon substrate 1. The silicon oxide film 2 has an opening in a central part of the silicon substrate 1. A silicon substrate 3 is bonded to the silicon substrate 1 via the silicon oxide film 2, The opening in the silicon oxide film 2 sandwiched between the silicon substrate 1 and silicon substrate 3 forms a cavity 4. Such a configuration is referred to as a cavity SOI wafer.

The silicon substrate 3 above the cavity 4 serves as a diaphragm 5. The cavity 4 and diaphragm 5 are quadrilateral in a planar view. No recess is formed in the surface of the silicon substrate 1 within the region of this diaphragm 5. A stress mitigating groove 6 is formed in the silicon oxide film 2 outside and around the diaphragm 5.

A piezoelectric device 7 is formed on each of the four sides of the diaphragm 5. The piezoelectric devices 7 are connected with diffused interconnects 8 and metal interconnects 9 to form a Wheatstone bridge circuit. A change in the amount of deflection of the diaphragm 5 due to a pressure change causes a change in diffusion value of the piezoelectric devices 7 in accordance with the change of stress applied to the piezoelectric devices 7 arranged on the four sides of the diaphragm 5. Thus pressure changes can be output as changes in voltage value.

Since the silicon substrate 1 and silicon substrate 3 are bonded together in vacuum, the inside of the cavity 4 contains a vacuum. The pressure sensor is therefore an absolute pressure sensor that uses the vacuum as the reference point for measuring pressure changes. The sensitivity to pressure changes can be controlled by adjusting the thickness and area of the diaphragm 5. The thickness of the diaphragm 5 corresponds to the thickness of the silicon substrate 3. The area of the diaphragm 5 corresponds to the area of the cavity 4. A protective film 10 is formed on the silicon substrate 3.

Figure 3:
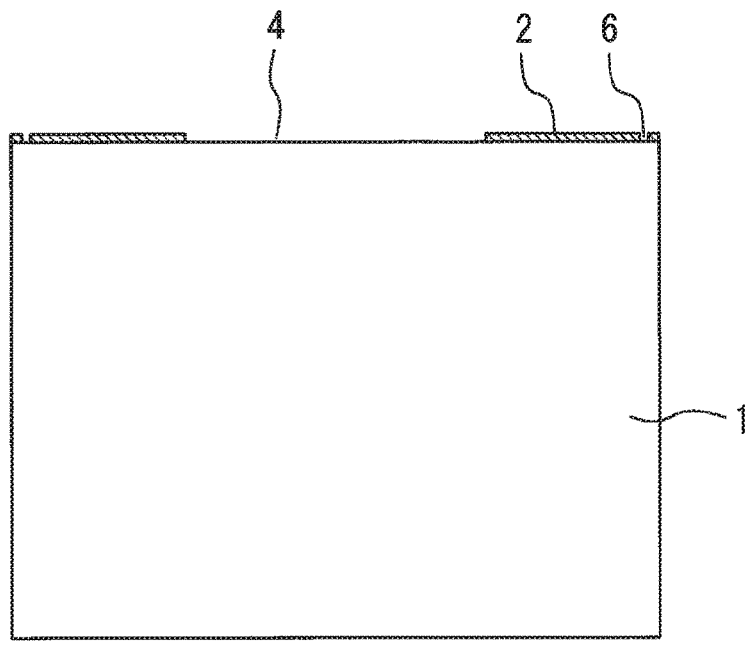
FIG. 3 and FIG. 4 are cross-sectional views illustrating a method of manufacturing the semiconductor pressure sensor according to Embodiment 1.
Figure 4:
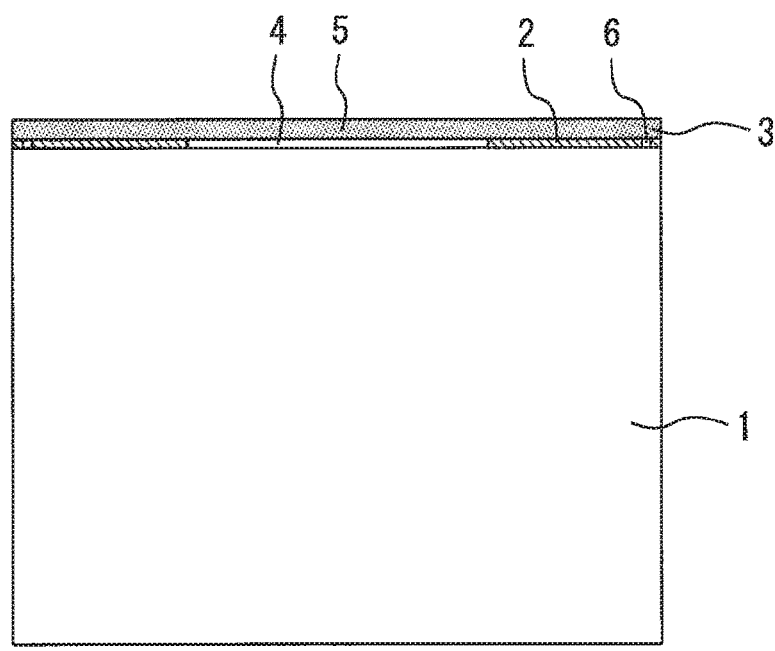

FIG. 3 and FIG. 4 are cross-sectional views illustrating a method of manufacturing the semiconductor pressure sensor according to Embodiment 1, As shown in FIG. 3, the silicon oxide film 2 is formed on the surface of the silicon substrate 1. The silicon oxide film 2 is etched in a central part of the chip to form the cavity 4, and the silicon oxide film 2 is etched in an outer peripheral part of the chip to form the stress mitigating groove 6.

Next, as shown in FIG. 4, the silicon substrate 1 and the silicon substrate 3 are joined together via the silicon oxide film 2 by bonding in vacuum. This makes the cavity 4 a vacuum cavity. The silicon substrate 3 is then polished to a desired thickness to form the diaphragm 5.

Next, as shown in FIG. 2, after impurity implantation, the silicon substrate 3 is annealed to form the piezoelectric devices 7, which are diffused resistors. The piezoelectric devices 7 are connected with the diffused interconnects 8 and the metal interconnects 9 to form a Wheatstone bridge circuit. Finally, the protective film 10 is formed on the silicon substrate 3.

Figure 5:
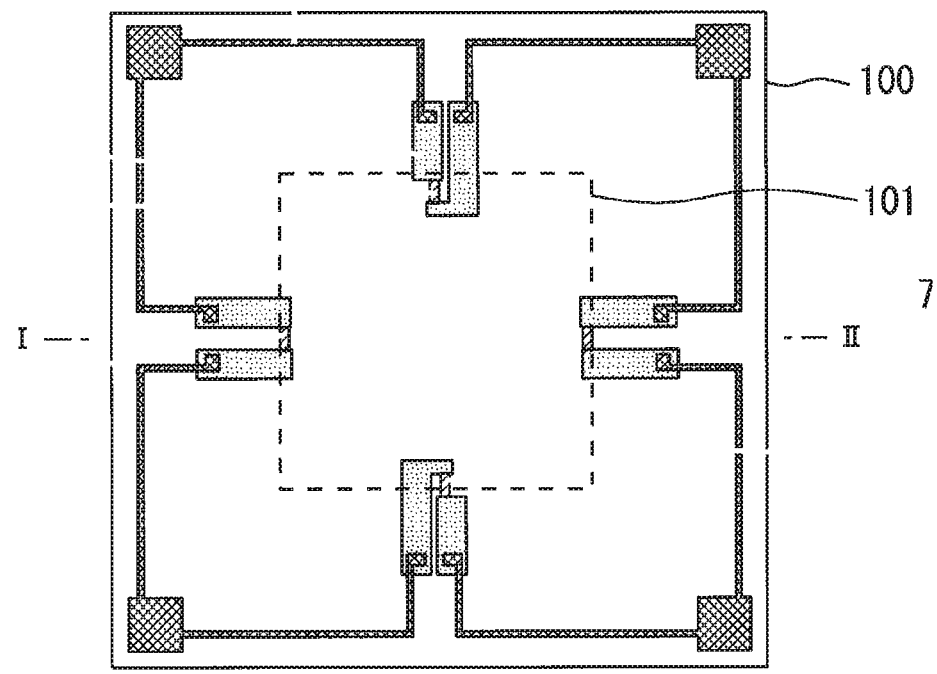
FIG. 5 is a plan view illustrating a semiconductor pressure sensor according to the comparative example.
Figure 6:
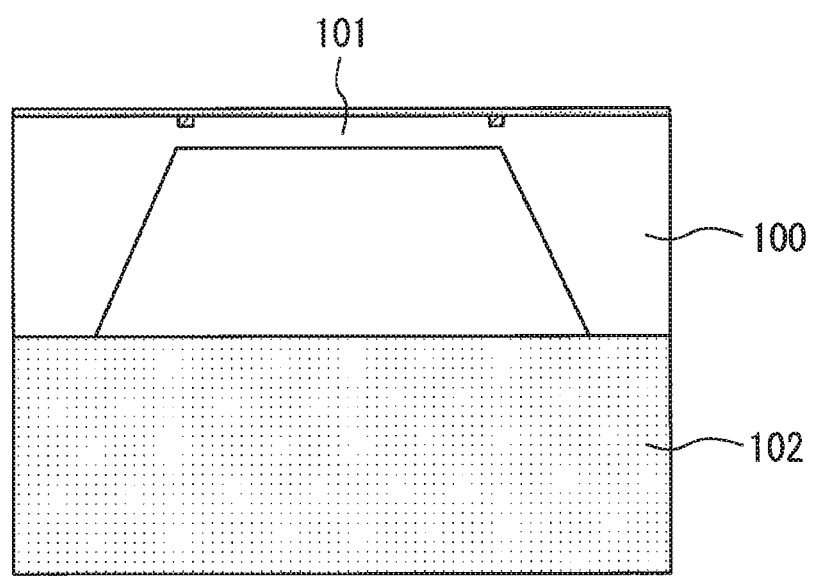
FIG. 6 is a cross-sectional view along I-II of FIG. 5.

Next, the effects of this embodiment will be explained in comparison to a comparative example. FIG. 5 is a plan view illustrating a semiconductor pressure sensor according to the comparative example. FIG. 6 is a cross-sectional view along I-II of FIG. 5. In the comparative example, after polishing the backside of the silicon substrate 100, the silicon substrate 100 is etched from the backside to form a diaphragm 101. In-plane variations of the polished amount and etched amount result in a variation of the thickness of the diaphragm 101. Because of the variation, the thickness cannot be made smaller than about 20 μm. If the sensor is to be configured as an absolute pressure sensor, a glass 102 needs to be anodically bonded to the backside of the silicon substrate 100 to form a vacuum cavity, which makes the manufacturing process complex.

In contrast, in this embodiment, the silicon substrate 3 bonded to the silicon substrate 1 via the silicon oxide film 2 serves as the diaphragm 5. The backside of the silicon substrate 3 is polished, so that the diaphragm 5 has less in-plane variation and can be made thinner.

Moreover, the silicon substrate 1 below the cavity 4 functions as a stopper for the diaphragm 5 to limit the amount of deflection of the diaphragm 5. Since no recess is formed in the surface of the silicon substrate 1, the height of the cavity 4 is determined by the film thickness of the silicon oxide film 2. This height of the cavity 4 determines the movable range of the diaphragm 5 in response to pressure changes. By controlling the film thickness of the silicon oxide film 2, the height of the cavity 4 can be easily set such that the diaphragm 5 will not be subjected to a stress of its fracture strength or more.

For example, for a pressure sensor with an absolute pressure of 1 atm, the diaphragm 5 may be 400 μm square and 10 μm thick, while the cavity 4 may be about 1.5 μm high, so that the silicon substrate 1 will function as a stopper by contacting the diaphragm 5 when a pressure of about 5 atm is applied.

Since the height of the cavity 4 equals to the film thickness of the silicon oxide film 2, an increase in the thickness of the silicon oxide film 2 leads to increased warping of the entire cavity SOI wafer. This will cause problems since largely warped wafers cannot be transferred, and to control the warping amount of the wafer, the wafer process will be more complex. The stress mitigating groove 6 provided in the silicon oxide film 2 around the diaphragm 5 can reduce the warping. For example, the stress mitigating groove 6 can be 1 μm wide, and distanced from the cavity 4 by 300 μm. The width of the stress mitigating groove 6 can be even smaller than 1 μm, as long as the silicon oxide film 2 is separated in an outer peripheral part of the chip. Thus a semiconductor pressure sensor having a hardly breakable diaphragm 5 and easy to handle can be obtained.

Figure 7:
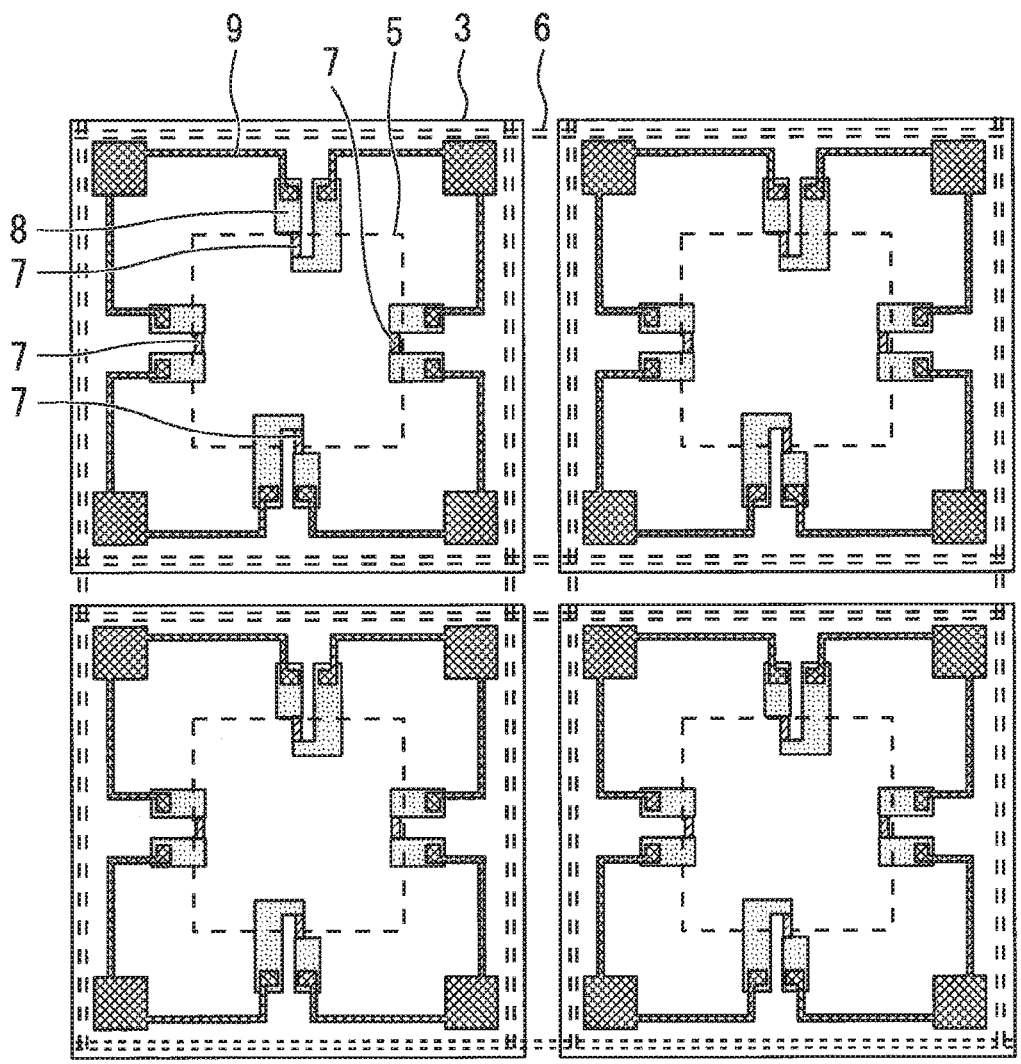
FIG. 7 is a plan view illustrating a variation example of the semiconductor pressure sensor according to Embodiment 1.

FIG. 7 is a plan view illustrating a variation example of the semiconductor pressure sensor according to Embodiment 1. In comparison to FIG. 1 where the stress mitigating groove 6 is provided discretely for each chip, the stress mitigating groove 6 may be arranged continuously over adjacent chips as shown in FIG. 7. This can help further reduce the warping of the wafer.

Embodiment 2

Figure 8:
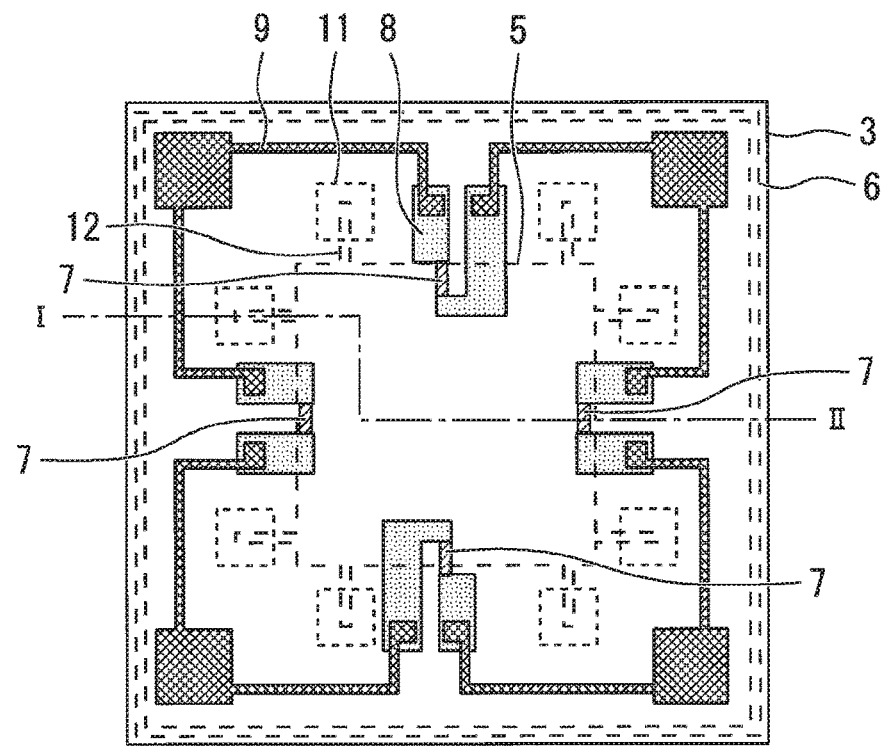
FIG. 8 is a plan view illustrating a semiconductor pressure sensor according to Embodiment 2.
Figure 9:
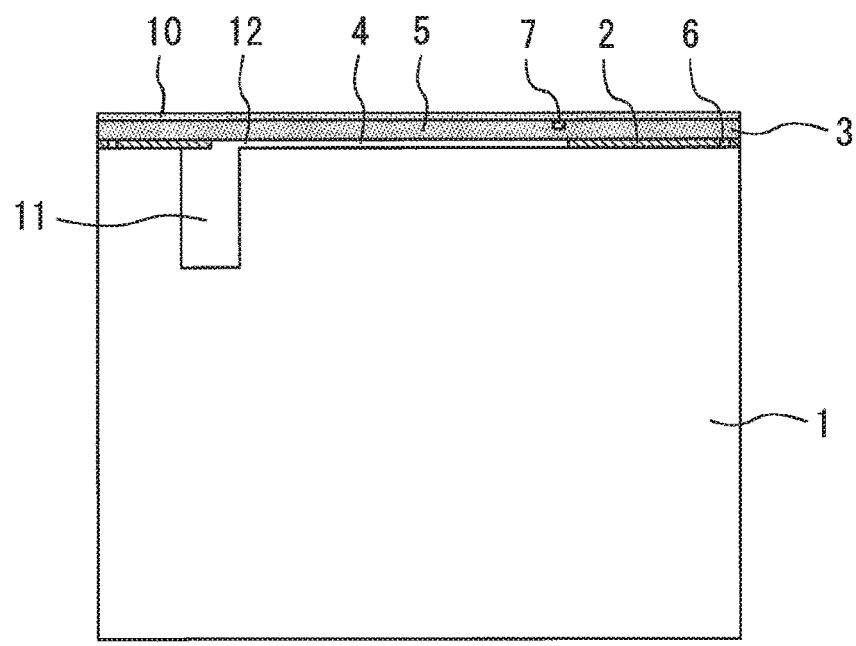
FIG. 9 is a cross-sectional view along I-II of FIG. 8.

FIG. 8 is a plan view illustrating a semiconductor pressure sensor according to Embodiment 2. FIG. 9 is a cross-sectional view along I-II of FIG. 8. Cavity extension spaces 11 are formed in the surface of the silicon substrate 1 outside the region of the diaphragm 5. The cavity extension spaces 11 are recesses formed in the surface of the silicon substrate 1. The cavity extension spaces 11 are connected to the cavity 4 via extension space introduction holes 12.

Figure 10:
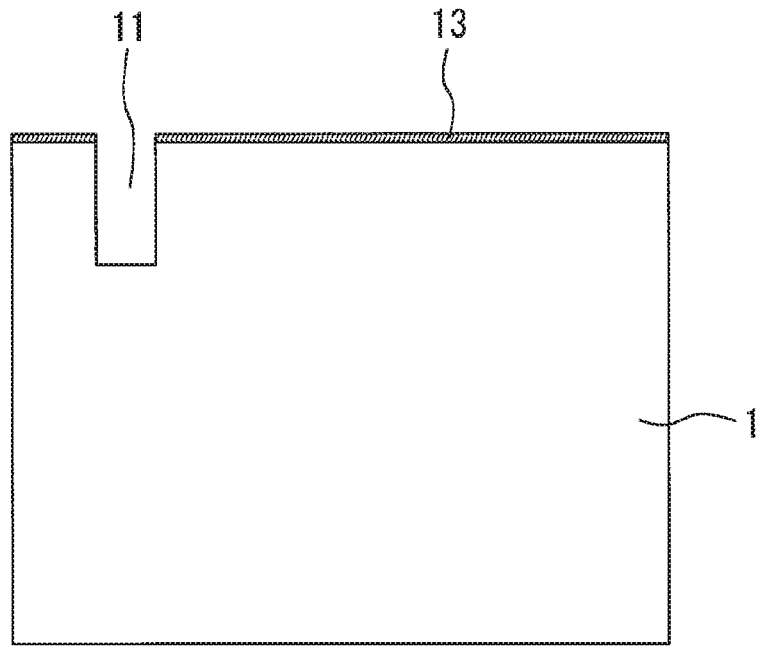
FIG. 10 to FIG. 12 are cross-sectional views illustrating a method of manufacturing the semiconductor pressure sensor according to Embodiment 2.
Figure 11:
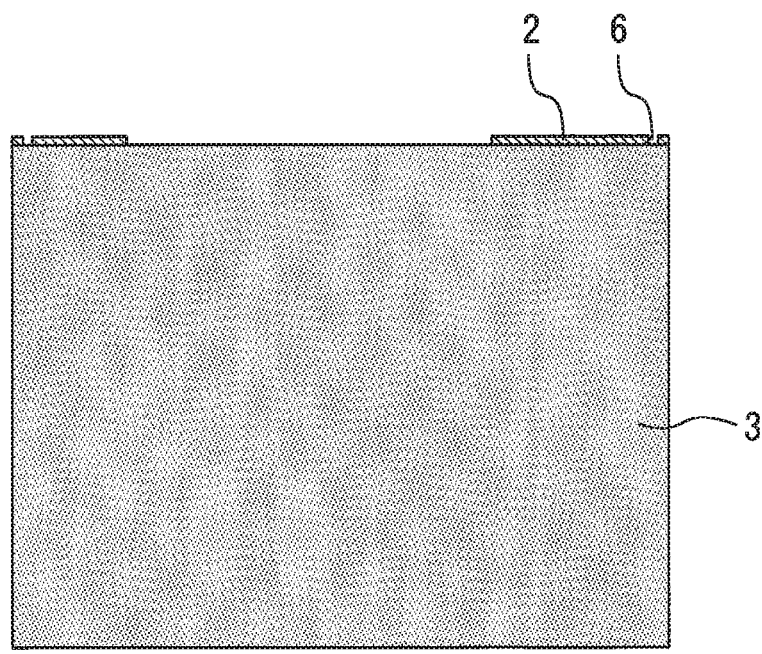
Figure 12:
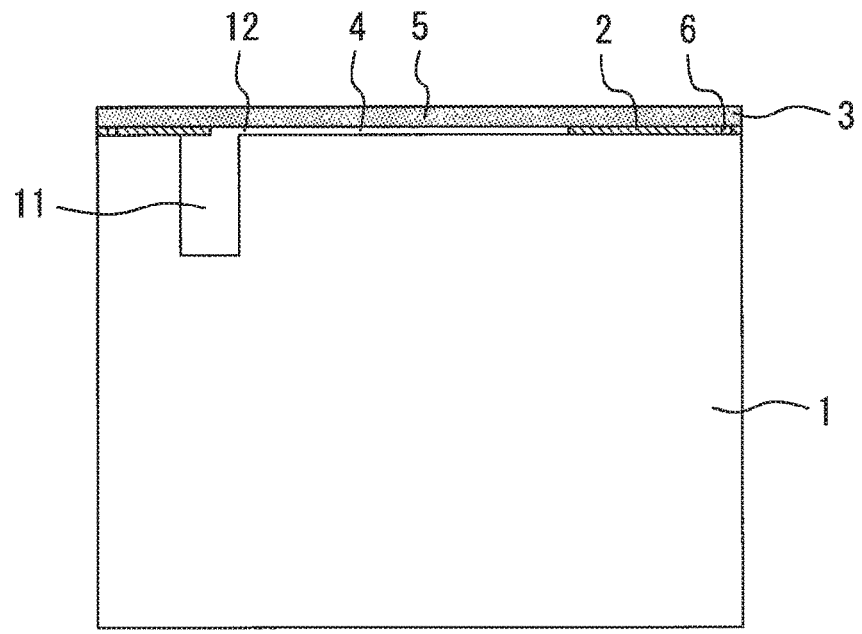

FIG. 10 to FIG. 12 are cross-sectional views illustrating a method of manufacturing the semiconductor pressure sensor according to Embodiment 2. First, as shown in FIG. 10, a silicon oxide film 13 having openings is formed on the silicon substrate 1. The silicon substrate 1 is then etched, using the silicon oxide film 13 as a mask, to form the cavity tension spaces 11. After that, the silicon oxide film 13 is removed. After the removal, another silicon oxide film may be formed again over the entire surface of the wafer.

Next, as shown in FIG. 11, the silicon oxide film 2 is formed on the silicon substrate 3, and the stress mitigating groove 6, the extension space introduction holes 12, and the cavity 4 are formed by photolithography and etching.

Next, as shown in FIG. 12, the silicon substrate 1 with the cavity extension spaces 11 formed therein and the silicon substrate 3 are bonded together via the silicon oxide film 2 in vacuum. This creates a vacuum in the stress mitigating groove 6, the extension space introduction holes 12, and the cavity 4. The silicon substrate 3 is polished to a desired thickness to form the diaphragm 5.

Next, as shown in FIG. 9, after impurity implantation, the silicon substrate 3 is annealed to form the piezoelectric devices 7, which are diffused resistors. The piezoelectric devices 7 are connected with the diffused interconnects 8 and the metal interconnects 9 to form a Wheatstone bridge circuit. Finally, the protective film 10 is formed on the silicon substrate 3.

If the cavity 4 has a small height and thus a small capacity, the tracking performance of the amount of deflection in the diaphragm 5 with the pressure changes will be poor. This can degrade the linearity of the output voltage. By providing the cavity extension spaces 11, the capacity of the cavity 4 can substantially be increased. This can prevent degradation of the linearity of the output voltage. Since the cavity extension spaces 11 are formed outside the region of the diaphragm 5, the height of the cavity 4 below the diaphragm 5 is not increased. Thus a semiconductor pressure sensor that has a hardly breakable diaphragm and excellent pressure sensor characteristics, and is easy to handle, can be obtained.

Embodiment 3

Figure 13:
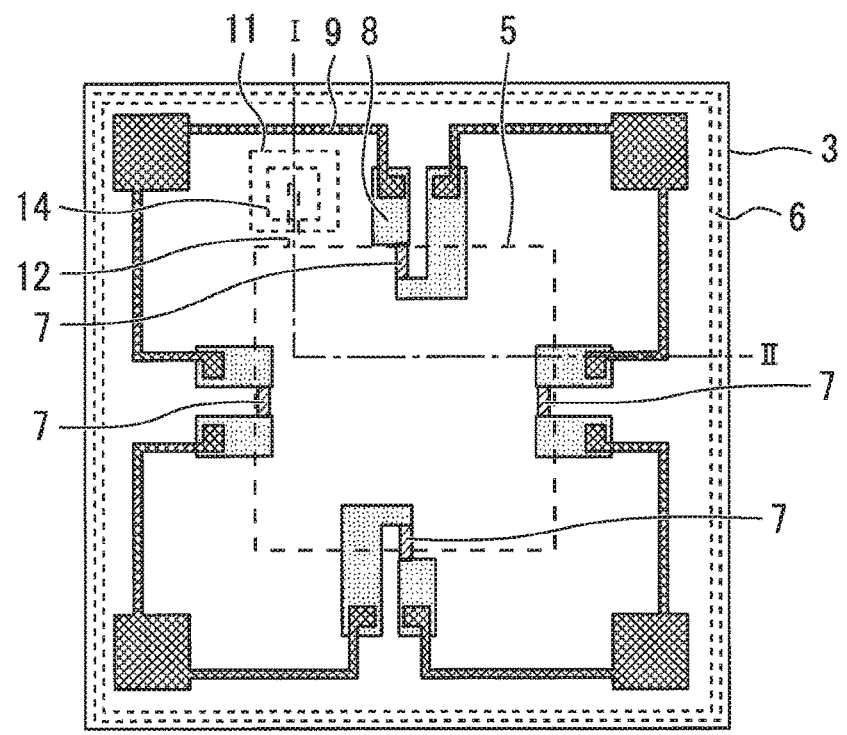
FIG. 13 is a plan view illustrating a semiconductor pressure sensor according to Embodiment 3.
Figure 14:
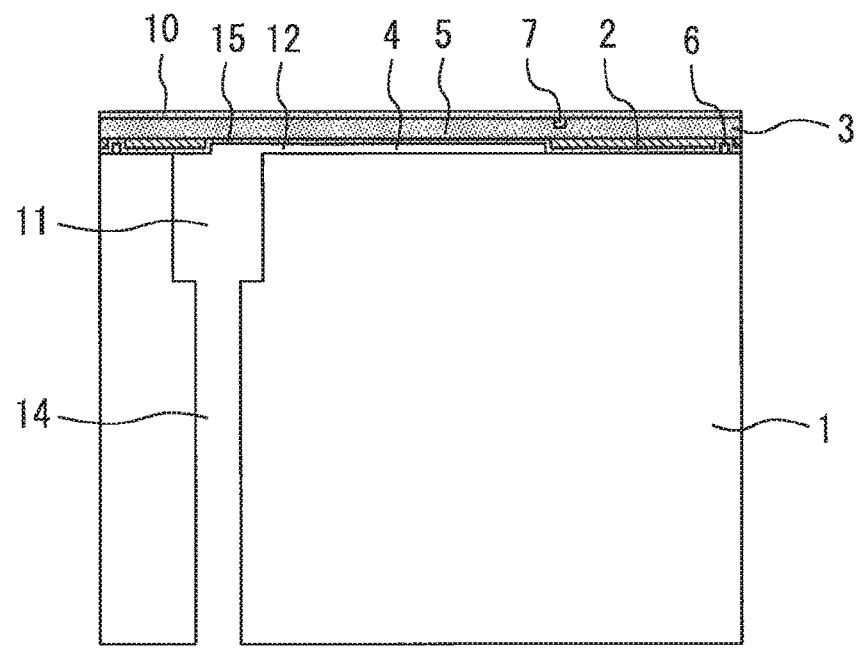
FIG. 14 is a cross-sectional view along I-II of FIG. 13.

FIG. 13 is a plan view illustrating a semiconductor pressure sensor according to Embodiment 3. FIG. 14 is a cross-sectional view along of FIG. 13. While the semiconductor pressure sensors according to Embodiments 1 and 2 are absolute pressure sensors, the semiconductor pressure sensor of this embodiment is a differential pressure sensor.

There are formed pressure introduction holes 14 that extend from the backside of the silicon substrate 1 and reach the cavity extension space 11. This allows the diaphragm 5 to move in response to a pressure difference between above and below the diaphragm. A differential pressure sensor that detects a pressure difference between above and below the diaphragm 5 can thus be obtained.

Figure 15:
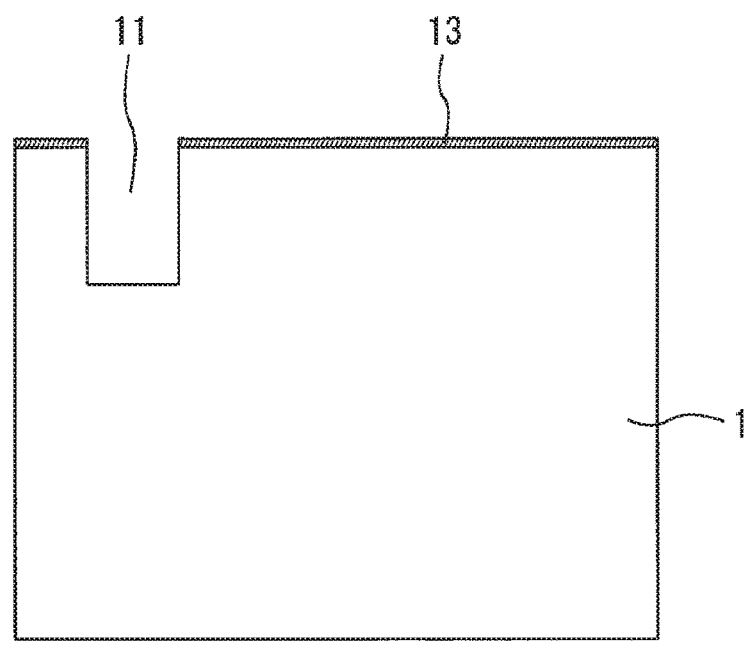
FIG. 15 to FIG. 17 are cross-sectional views illustrating a method of manufacturing the semiconductor pressure sensor according to Embodiment 3.
Figure 16:
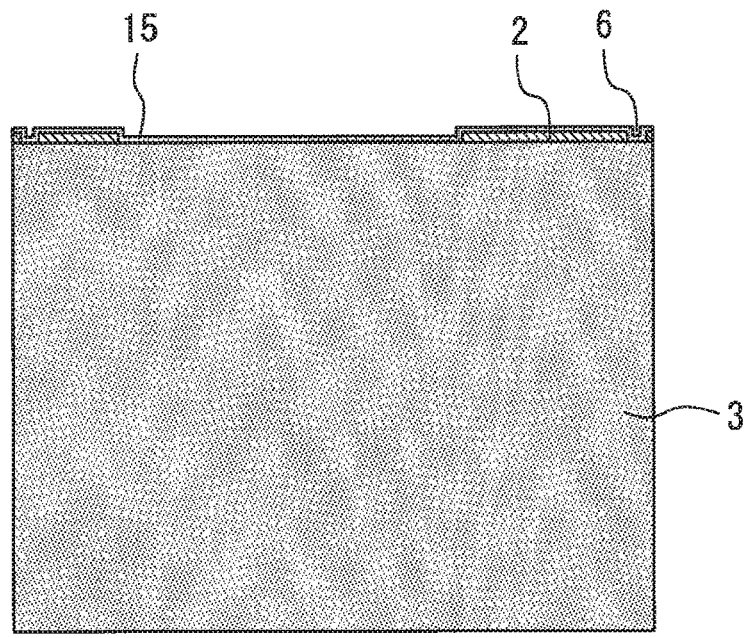
Figure 17:
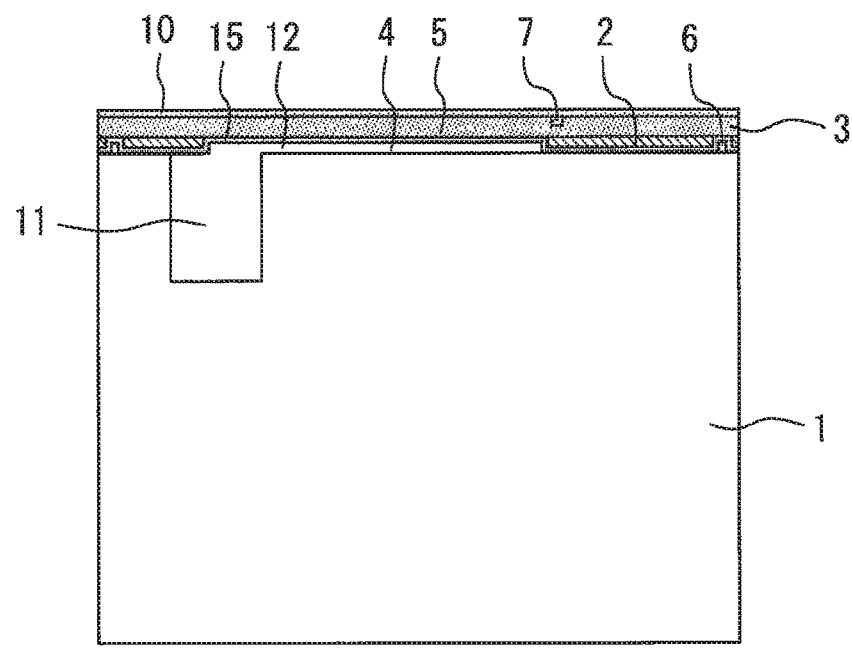

FIG. 15 to FIG. 17 are cross-sectional views illustrating a method of manufacturing the semiconductor pressure sensor according to Embodiment 3. First, as shown in FIG. 15, a silicon oxide film 13 having openings is formed on a silicon substrate 1. The silicon substrate 1 is then etched, using the silicon oxide film 13 as a mask, to form the cavity extension space 11. After that, the silicon oxide film 13 is removed. After the removal, another silicon oxide film may be formed again over the entire surface of the wafer.

Next, as shown in FIG. 16, the silicon oxide film 2 is formed on the silicon substrate 3, and the stress mitigating groove 6, the extension space introduction hole 12, and the cavity 4 are formed by photolithography and etching. A silicon oxide film 15 is formed over the entire surface. The stress mitigating groove 6 may be provided in the silicon oxide film 15, too, but not necessarily, since the silicon oxide film 15 can be made thinner as compared to the silicon oxide film 2.

Next, as shown in FIG. 17, the silicon substrate 1 with the cavity extension space 11 formed therein and the silicon substrate 3 are bonded together via the silicon oxide films 2 and 15 in vacuum. This creates a vacuum in the stress mitigating groove 6, the extension space introduction hole 12, and the cavity 4. The silicon substrate 3 is polished to a desired thickness to form the diaphragm 5.

Next, as shown in FIG. 17, after impurity implantation, the silicon substrate 3 is annealed to form the piezoelectric devices 7, which are diffused resistors. The piezoelectric devices 7 are connected with the diffused interconnects 8 and metal interconnects 9 to form a Wheatstone bridge circuit. Finally, the protective film 10 is formed on the silicon substrate 3.

Next, as shown in FIG. 14, the silicon substrate 1 is etched from the backside to form the pressure introduction hole 14 which reaches the cavity extension space 11. During this through etching, the silicon oxide film 15 protects the diaphragm 5 so that the configuration of the already formed diaphragm 5 is not impaired.

Since the pressure introduction hole 14 is formed to the cavity extension space 11 located outside the region of the diaphragm 5, the height of the cavity 4 below the diaphragm 5 is not increased. Thus a semiconductor pressure sensor that detects a differential pressure, having a thin but hardly breakable diaphragm and easy to handle, can be obtained.

Obviously many modifications and variations of the present invention are possible in the light of the above teachings. It is therefore to be understood that within the scope of the appended claims the invention may be practiced otherwise than as specifically described.

The entire disclosure of Japanese Patent Application No. 2018-038830, filed on Mar. 5, 2018 including specification, claims, drawings and summary, on which the Convention priority of the present application is based, is incorporated herein by reference in its entirety.

The invention claimed is:

1. A semiconductor pressure sensor comprising:
a first semiconductor substrate having a surface;
an oxide film provided on the surface of the first semiconductor substrate and having a cavity;
a second semiconductor substrate bonded to the first semiconductor substrate via the oxide film and having a diaphragm above the cavity; and
a piezoelectric device provided on the diaphragm,
wherein no recess is provided in the surface of the first semiconductor substrate within a region of the diaphragm, and
a stress mitigating groove is provided in the oxide film outside and around the diaphragm.

2. The semiconductor pressure sensor according to claim 1, wherein a cavity extension space connected to the cavity is provided in the surface of the first semiconductor substrate outside the region of the diaphragm.

3. The semiconductor pressure sensor according to claim 2, wherein a pressure introduction hole which extends from a backside of the first semiconductor substrate and reaches the cavity extension space is provided.

* * * * *